United States Patent [19]
Hong et al.

[11] Patent Number: 5,614,746
[45] Date of Patent: Mar. 25, 1997

[54] STRUCTURE AND PROCESS OF MANUFACTURE OF SPLIT GATE FLASH MEMORY CELL

[75] Inventors: Gary Hong; Hwi-Huang Chen, both of Hsin-chu, Taiwan

[73] Assignee: United Microelectronics Corporation, Hsin-Chu, Taiwan

[21] Appl. No.: 494,632

[22] Filed: Jun. 23, 1995

Related U.S. Application Data

[62] Division of Ser. No. 345,126, Nov. 28, 1994, Pat. No. 5,445,984.

[51] Int. Cl.⁶ .................................................. H01L 29/788
[52] U.S. Cl. .......................................... 257/316; 257/319
[58] Field of Search ................................ 257/322, 316, 257/315, 326, 319, 320, 321, 900; 437/43

[56] References Cited

U.S. PATENT DOCUMENTS

| | | | |
|---|---|---|---|
| 4,935,378 | 6/1990 | Mori | 257/316 |
| 5,032,881 | 7/1991 | Sardo et al. | 257/316 |
| 5,151,375 | 9/1992 | Kazerounian et al. | 437/43 |
| 5,194,925 | 3/1993 | Ajika et al. | 257/314 |
| 5,274,588 | 12/1993 | Manzur et al. | 365/185 |
| 5,280,446 | 1/1994 | Ma et al. | 365/185 |
| 5,330,938 | 7/1994 | Camerlenghi | 437/43 |

Primary Examiner—Sara W. Crane
Attorney, Agent, or Firm—William H. Wright

[57] ABSTRACT

A method is provided for fabricating a split gate flash EPROM device. A stack is formed of a first dielectric layer on the lightly doped semiconductor substrate followd by a floating gate, a first intergate dielectric layer, an intermediate control gate layer, an isolating layer over the intermediate control gate layer, and a floating gate mask on the device. The stack is formed by etching in the pattern of the floating gate. A split gate mask is formed followed by ion implanting dopant into source/drain regions in the substrate adjacent to the mask with one source/drain region self aligned with the stack and the other spaced away from the other side of the stack. After mask removal, a second intergate dielectric layer blanket is formed with an etch back forming sidewalls next to the stack by etching away exposed portions of the first dielectric layer, forming a second dielectric layer on the substrate and the source/drain regions. Removal of the isolating layer over the intermediate control gate layer follows. Then a blanket control gate layer over the device and a control gate mask are formed, patterning the control gate layer by etching portions of the control gate layer unprotected by the control gate mask, and removal of the control gate mask.

18 Claims, 6 Drawing Sheets

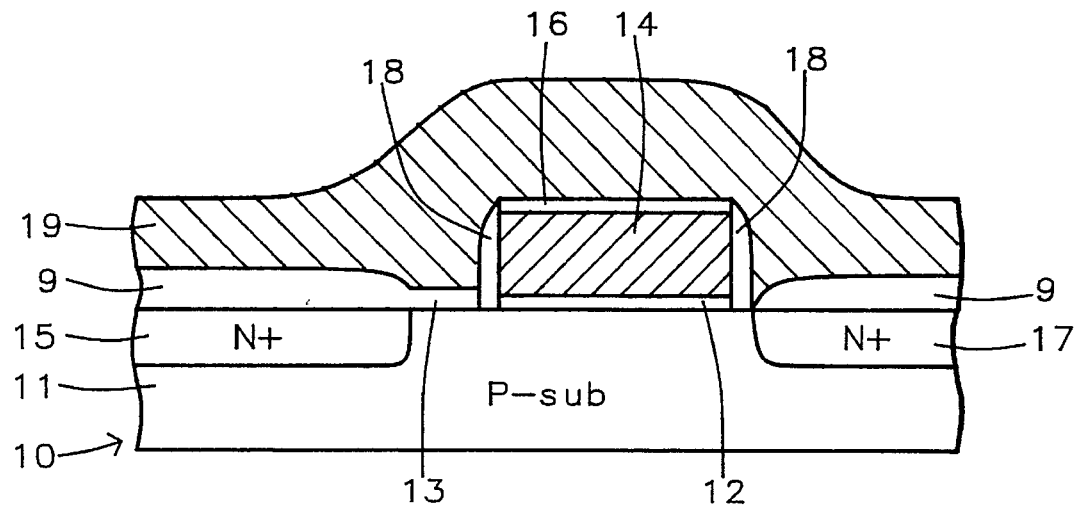
FIG. 1 – Prior Art
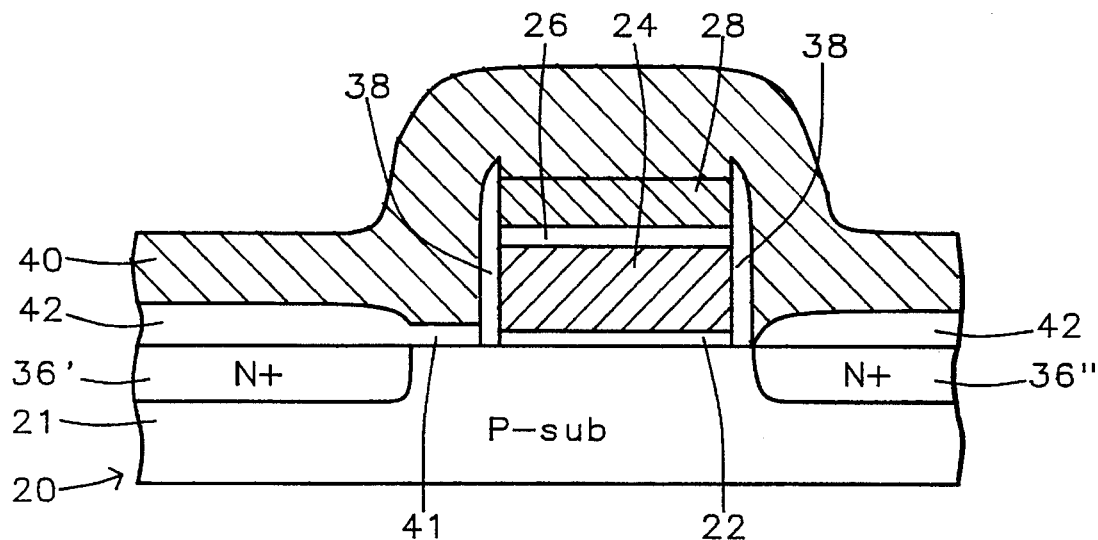
FIG. 2

STRUCTURE AND PROCESS OF MANUFACTURE OF SPLIT GATE FLASH MEMORY CELL

This application is a divisional of application Ser. No. 08/345,126, filed Nov. 28, 1994 and now U.S. Pat. No. 5,445,984.

BACKGROUND OF THE INVENTION

1. Field of the Invention

This invention relates to semiconductor memories and more particularly to split gate flash memories.

2. Description of Related Art

Referring to FIG. 1, a fragmentary sectional view of a conventional prior art split gate flash EPROM device 10 is shown which includes a P− substrate 11 with N+ S/D regions 15, 17 formed in substrate 11 on either side beneath a polysilicon 1 floating gate 14 formed above a thin tunnel oxide region 12 formed as a layer on substrate 11. Above the floating gate 14 is a thin ONO layer 16. At the ends of the tunnel oxide layer 12, floating gate 14 and ONO layer 16 are silicon dioxide spacer structures 18. Over the remainder of the substrate 11 gate oxide 13 and field oxide structures 9 are formed. Above the ONO layer 16, the spacer structures 18, the gate oxide 13 and field oxide structures 9 is formed a polysilicon 2 control gate layer 19. The edge of the floating gate 14 is adjacent to one S/D region 17 but is substantially spaced away from the other S/D region 15. The control gate 19 however, which overlies the floating gate 14 extends over the length of the portion of device 11 which is shown. The problem with the device of FIG. 1 is with charge retention due to the poor quality of the sidewall silicon dioxide.

U.S. Pat. No. 5,280,446 of Ma et al for "Flash EPROM Memory Circuit Having Source Side Programming", U.S. Pat. No. 5,274,588 of Manzur et al for "Split-Gate for an EEPROM", and U.S. Pat. No. 5,194,925 of Ajika et al for "Electrically Programmable Non-Volatile Semiconductor Memory Device" show prior art split gate, flash EEPROM processes and structures.

SUMMARY OF THE INVENTION

An object of this invention is to provide an improved level of charge retention by improved quality of sidewall dielectric material.

In accordance with this invention, a device and the method of manufacture thereof are provided. The method comprises fabricating an MOSFET device on a lightly doped semiconductor substrate by the process as follows:

forming a first dielectric layer on the substrate, forming a floating gate over the dielectric layer, forming a first intergate dielectric layer over the floating gate, forming an intermediate control gate layer over the intergate dielectric layer, forming an isolating layer over the intermediate control gate layer, forming a floating gate mask on the device, etching the floating gate, the first intergate dielectric layer, the intermediate control gate layer and the isolating layer to form a stacked structure of the etched layers in the pattern of the floating gate, forming a split gate mask on the device, ion implanting dopant into source/drain regions in the substrate adjacent to the split gate mask with one of the source drain regions being self aligned with the stacked structure and the other thereof being spaced away from the other side of the stacked structure by the split gate mask, removal of the split gate mask, forming a second intergate dielectric layer blanket on the device, performing an etch back of the second intergate dielectric layer to form sidewalls adjacent to the stack by etching, etching away exposed portions of the first dielectric layer, forming a second dielectric layer on the substrate and the source/drain regions, removal of the isolating layer over the intermediate control gate layer, forming a blanket control gate layer over the device, forming a control gate mask on the device, patterning the control gate layer by etching portions of the control gate layer unprotected by the control gate mask, and removal of the control gate mask.

Preferably, the second dielectric layer comprises a gate oxide layer having a thickness of between about 200Å and about 400Å over the substrate and a thick, field oxide layer having a thickness of between about 500Å and about 1,000Å;

the second dielectric layer is grown by thermal oxidation at a temperature within the range between about 900° C. and about 1000° C.;

source/drain regions are implanted into substrate with arsenic (As) N+ dopant with an energy between about 30 keV and about 100 keV, and a dose of As within a range of doses between about $1\times10^{15}/cm^2$ and about $6\times10^{15}/cm^2$; and preferably the source/drain regions are implanted into substrate with arsenic (As) N+ dopant with an energy of about 50 keV, and a dose of As of about $2\times10^{15}/cm^2$;

intermediate control gate layer has a thickness of between about 500Å and about 800Å;

isolating layer has a thickness of between about 200Å and about 1,000Å;

control gate layer has a thickness of between about 2,000Å and about 4,000Å;

In accordance with another aspect of this invention, a method of fabricating an MOSFET device on a lightly doped semiconductor substrate comprises forming a tunnel oxide layer on substrate, forming a first polysilicon layer over dielectric layer, first polysilicon layer comprising a floating gate, forming a first ONO layer over first polysilicon layer, forming a second polysilicon layer over ONO layer, forming a silicon nitride layer over second polysilicon layer, forming a floating gate mask on device, etching first polysilicon layer, ONO layer, second polysilicon layer and the silicon nitride layer to form a stacked structure of etched layers in pattern of floating gate, forming a split gate mask on device, ion implanting dopant into source/drain regions in substrate adjacent to split gate mask with one of source drain regions being self aligned with stacked structure and other thereof being spaced away from other side of stacked structure by split gate mask, removal of split gate mask, forming a second ONO layer blanket on device, performing an etch back of second ONO layer to form sidewalls adjacent to stack by etching, etching away exposed portions of tunnel oxide layer, forming a second dielectric layer on substrate and source/drain regions, removal of silicon nitride layer over second polysilicon layer, forming a blanket third polysilicon layer over device, forming a control gate mask on device, patterning third polysilicon layer by etching portions of third polysilicon layer unprotected by control gate mask, and removal of control gate mask.

Preferably, the second dielectric layer comprises a gate oxide layer having a thickness of between about 200Å and about 400Å over the substrate and a thick, field oxide layer having a thickness of between about 500Å and about 1,000Å;

second dielectric layer is grown by thermal oxidation at a temperature within range between about 900° C. and about 1000° C.;

second polysilicon layer has a thickness of between about 500Å and about 800Å.

silicon nitride layer has a thickness of between about 200Å and about 1,000Å;

third polysilicon layer has a thickness of between about 2,000Å and about 4,000Å;

source/drain regions are implanted into substrate with arsenic (As) N+ dopant with an energy between about 30 keV and about 100 keV, and a dose of As within a range of doses between about $1 \times 10^{15}/cm^2$ and about $6 \times 10^{15}/cm^2$; and preferably source/drain regions are implanted into substrate with arsenic (As) N+ dopant with an energy of about 50 keV, and a dose of As of about $2 \times 10^{15}/cm^2$.

BRIEF DESCRIPTION OF THE DRAWINGS

The foregoing and other aspects and advantages of this invention are explained and described below with reference to the accompanying drawings, in which:

FIG. 1 shows a fragmentary sectional view of a conventional prior art split gate flash EPROM device formed on a P– substrate with N+ S/D regions formed therein on either side beneath a floating gate formed above a thin tunnel oxide region on the substrate.

FIG. 2 shows a device a cross-sectional view of a fragment of a split gate, flash EEPROM device made in accordance with this invention formed on a P– substrate with N+ S/D regions formed therein substrate on either side beneath a floating gate formed above a thin tunnel oxide region formed as a layer on the substrate.

DESCRIPTION OF THE PREFERRED EMBODIMENT

Figure 3A:
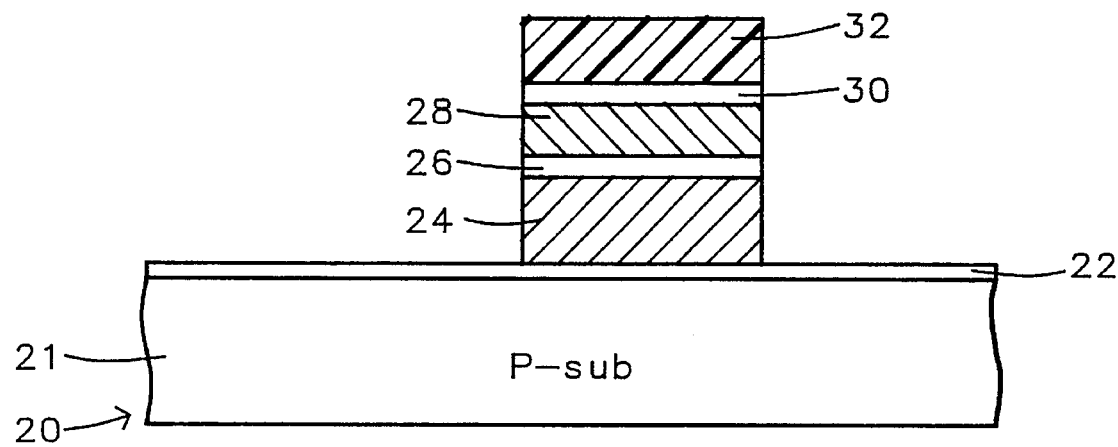
FIG. 3A shows the device after a mask has been used to etch a first polysilicon blanket layer, a first intergate dielectric (ONO) layer, a second polysilicon intermediate control gate layer and a silicon nitride isolating layer.

This invention provides a structure and a process sequence for producing a high-density split-gate flash EEPROM memory.

FIG. 2 shows a device a cross-sectional view of a fragment of a device 20 made in accordance with this invention. The split gate, flash EEPROM device 20 in FIG. 2 includes a P-substrate 21 with N+ S/D regions 36', 36" formed in substrate 21 on either side beneath a polysilicon 1 floating gate 24 formed above a thin tunnel oxide region 22 formed as a layer on substrate 21. Above the floating gate 24 is a thin intergate dielectric (ONO) layer 26, which is covered in turn by a polysilicon 2 intermediate control gate layer 28, which is substantially free from oxide because of the improved process of this invention. At the ends of the tunnel oxide layer 22, floating gate 24 and intergate dielectric (ONO) layer 26 are intergate dielectric (ONO) spacer structures 38. Over the remainder of the substrate 21 gate oxide 41 and field oxide structures 42 are formed. Above the intermediate control gate layer 28, the intergate dielectric (ONO) spacer structures 38, the gate oxide 41 and field oxide structures 42 is formed a polysilicon 3 control gate layer 40. The edge of the floating gate 24 is adjacent to one S/D region 36" but is substantially spaced away from the other S/D region 36'. The control gate 40 however, which overlies the floating gate 24 extends over the length of the portion of device 21 which is shown.

PROCESS

Front end process

In the early stages of fabrication in accordance with the method of this invention includes a substrate 20 of silicon doped as a P-sub.

Tunnel Oxidation

By the conventional process of tunnel oxidation the substrate 20 is covered with a blanket of a first dielectric (tunnel oxide) layer 22 having a thickness of between about 50Å and about 100Å in accordance with a process well known by those skilled in the art. The preferred process of growing the tunnel oxide is thermal oxidation in dry $O_2$ and $N_2$ (e.g. 850° C. for 20 minutes.)

Polysilicon 1

A polysilicon 1 floating gate layer 24 was deposited to a thickness of between about 1,000Å and about 2,000Å by the conventional LPCVD (low pressure chemical vapor deposition) process. A range of thicknesses between about 1,000Å and about 2,000Å is possible.

Polysilicon 1 floating gate layer 24 is doped with a blanket doping by diffusion of phosphoryl chloride (POCl₃) at 900° C. for 20 minutes. Alternatively by ion implantation of $P^{31}$ dopant is applied with a dose within a range of between about $1×10^{15}/cm^2$ and about $1×10^{16}/cm^2$ within a range of energies between about 20 keV and about 40 keV.

First Intergate Dielectric

Next, follows formation of an intergate dielectric, e.g. an(interpolysilicon dielectric sandwich of ONO with an effective thickness of ONO, preferably of about 200Å is applied to the exposed surfaces of the device of FIG. 5 by means of a conventional process. A range of thicknesses between about 150Å and about 300Å is possible.

Outside of that range of thicknesses the result is inadequate because it is too thin (below about 150Å) so that charge retention would be bad or too thick (above about 300Å) because of reduced coupling ratio.

O:N:O (Silicon Oxide:Silicon Nitride:Silicon Oxide)

O formation of silicon oxide to a thickness of about 80Å at a temperature within the range 900° to 1000° C. by thermal oxidation.

N Silicon nitride at deposited by LPCVD at 700°–800° C. thickness of between about 60Å and about 200Å formation of silicon oxide by thermal oxidation or CVD at about 900° C. to a thickness of about 20Å–50Å

Polysilicon 2

A polysilicon 2 intermediate control gate layer 28 was deposited to a thickness of about 500Å by the conventional LPCVD (low pressure chemical vapor deposition) process. A range of thicknesses between about 500Å and about 800Å is possible.

Polysilicon 2 intermediate control gate layer 28 is doped by a blanket doping; which is done by diffusion of phosphoryl chloride (POCl₃) at 900° C. for 20 min.; or it is done by doping of layer 28 is done by ion implantation with arsenic (As) dopant applied with a dose within a range between about $1×10^{15}/cm^2$ and about $1×10^{16}/cm^2$ within a range of energies between about 20 keV and about 40 keV.

Isolating Layer Silicon Nitride

A blanket deposition of a thin film silicon nitride (Si₃N₄) isolating layer 30 is deposited to a thickness of between about 200Å and about 1,000Å by a conventional process. The isolating silicon nitride layer 30 is used for isolating polysilicon 2 intermediate control gate layer 28 from subsequent intermediate processing steps. Isolating silicon nitride layer 30 protects the polysilicon 2 intermediate control gate layer 28 which is to be oxidized later in the process during formation of the sidewall silicon dioxide and the gate silicon dioxide.

Floating Gate Masking

Then photoresist mask structures 32 for etching polysilicon 1 layer 24, intergate dielectric (ONO) layer 26, polysilicon 2 intermediate control gate layer 28 and silicon nitride layer 30 is formed on the device 20.

Etching with Floating Gate Mask

FIG. 3A shows the device 20 after the mask 32 has been used to etch the polysilicon 1 blanket layer 24, first intergate dielectric (ONO) layer 26, polysilicon 2 intermediate control gate layer 28 and silicon nitride isolating layer 30.

Removal of Floating Gate Mask

Next, the photoresist mask 32 is removed.

Figure 3B:
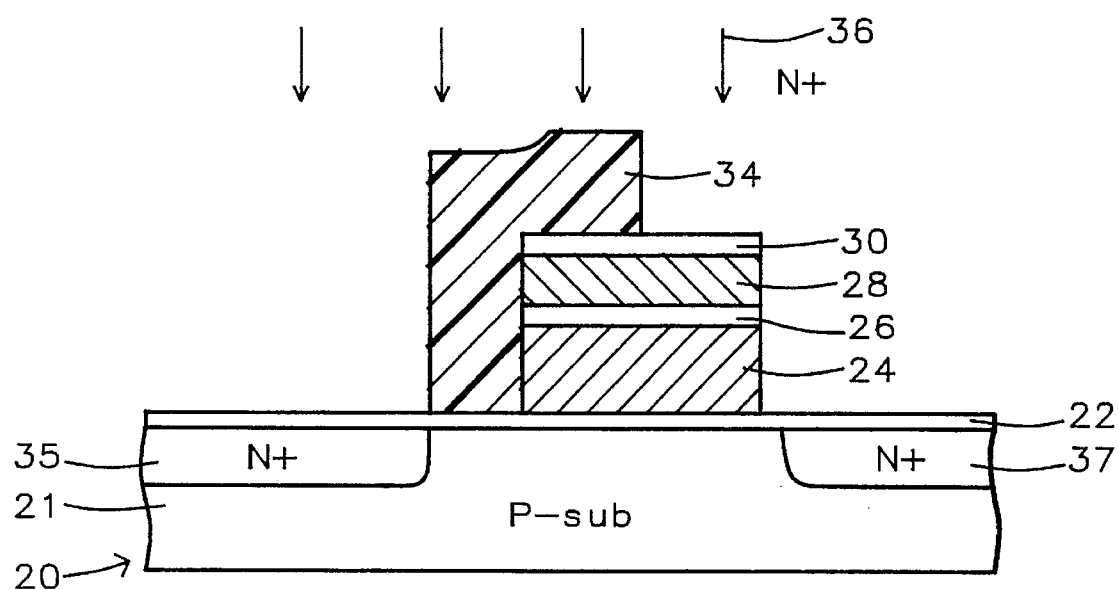
FIG. 3B shows the device of FIG. 3A after the mask has been removed from the device of FIG. 3A.

FIG. 3B shows the device of FIG. 3A after the mask 32 has been removed from the device of FIG. 3A.

Split Gate Masking

Then a photoresist mask structures 34 is formed over a portion of the silicon nitride isolating layer 30 and a portion of the gate oxide layer 22. Then N+ S/D (source/drain) dopant 36 is implanted into all of the exposed surface of the P-substrate 20. The implantation of those As ions is performed preferably with an energy of about 50 keV and a preferred dose of As of $2×10^{15}/cm^2$.

A range of energies between about 30 keV and about 100 keV, and a range of doses between about $1×10^{15}/cm^2$ and about $6×10^{15}/cm^2$ are possible.

Removal of Split Gate Mask

Figure 3C:
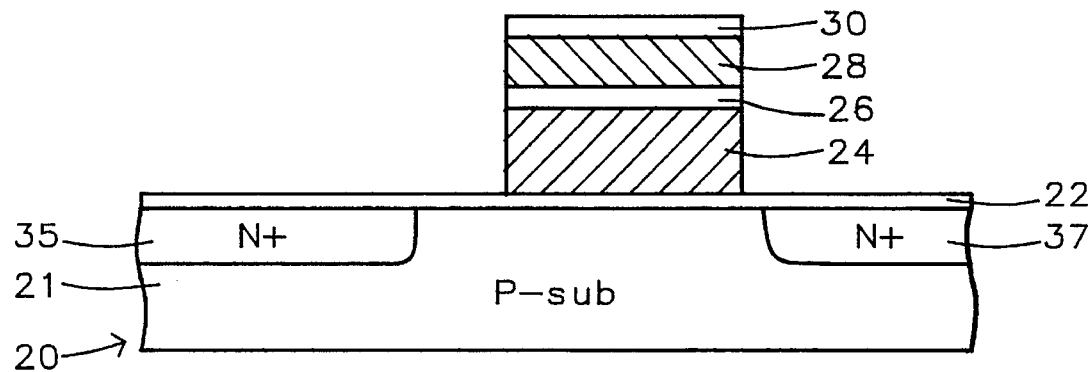
FIG. 3C shows the device of FIG. 3B after the mask 34 has been removed from the device of FIG. 3B.

FIG. 3C shows the device of FIG. 3B after the photoresist mask 34 has been removed from the device of FIG. 3B.

Formation of Intergate Dielectric

Figure 3D:
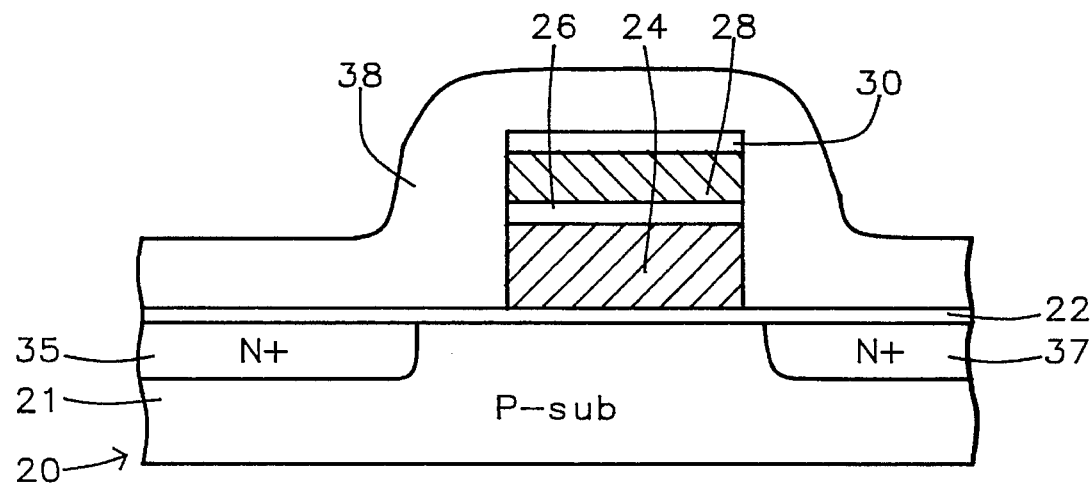
FIG. 3D shows the device of FIG. 3C after the formation of a first intergate dielectric (ONO) layer applied to the exposed surfaces of the device of FIG. 3B.

FIG. 3D shows the device of FIG. 3C after the formation of intergate dielectric (ONO) layer 38 with an effective thickness of ONO, preferably of about 1,000Å is applied to the exposed surfaces of the device of FIG. 3B by means of a conventional process. A range of thicknesses of intergate dielectric layer 38 (ONO) between about 500Å and about 2,000Å is possible. The process of forming the intergate dielectric (intergate dielectric) is the same as for intergate dielectric (ONO) layer 26.

O:N:O (Silicon Oxide:Silicon Nitride:Silicon Oxide)

O formation of silicon oxide to a thickness of about 80Å at a temperature within the range 900° to 1000° C. by thermal oxidation.

N Silicon nitride at deposited by LPCVD at 700°–800° C. thickness of between about 300Å and about 1000Å

O formation of silicon oxide by thermal oxidation or CVD at about 900° C. to a thickness of about 20–50Å.

Intergate Dielectric (ONO) Etch Back

Figure 3E:
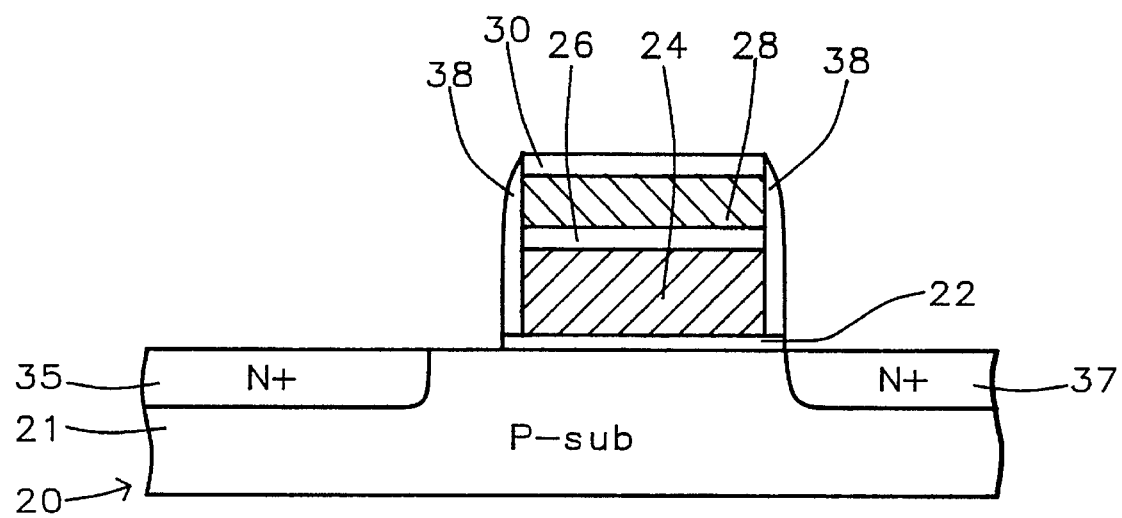
FIG. 3E shows the device of FIG. 3D after the formation of sidewalls from the first intergate dielectric (ONO) layer, alongside the stack of layers with the second polysilicon, intermediate control gate layer and the polysilicon control gate layer being short circuited together with exposed portions of thin tunnel oxide layer which are not covered by the stack of layers and by sidewall spacers etched away.

FIG. 3E shows the device of FIG. 3D after the formation of sidewalls 38 alongside the stack of layers 22, 24, 26, 28 and 30. The sidewall spacers 38 are formed by an anisotropic etch back performed on intergate dielectric (ONO) layer 38. The etching process used is preferably with SF₆, at 200 watts, at 300 mTorr, 100 sccm.

Polysilicon 2 intermediate control gate layer 28 serves the purpose of protecting the intergate dielectric (ONO) layer 26 from being damaged during the etch back of intergate dielectric (ONO) sidewall spacer layer 38.

Figure 3F:
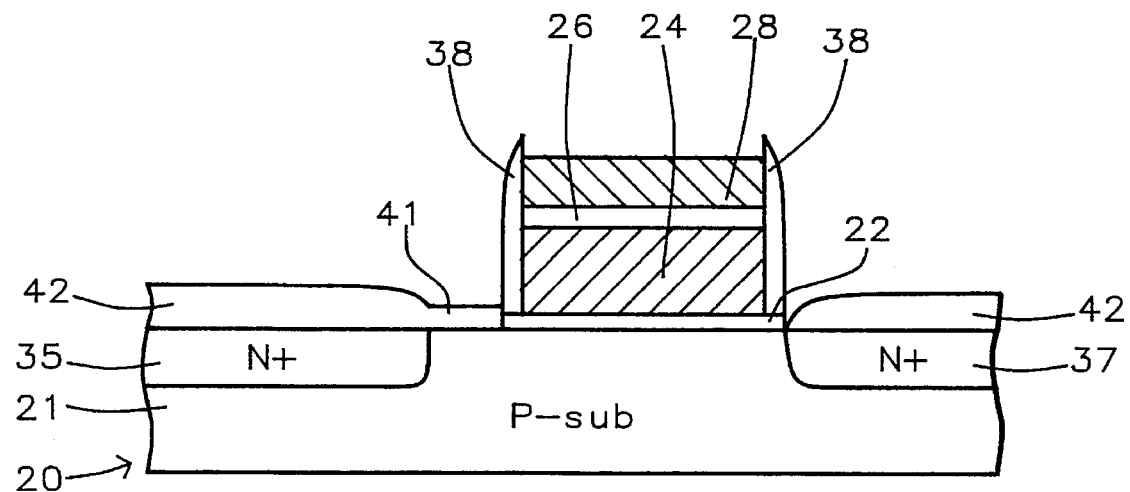
FIG. 3F shows a second layer of dielectric material in the form of gate oxide layer and a FOX layer grown by thermal oxidation.

Silicon nitride isolating layer 30 protects the polysilicon 2 intermediate control gate layer 28 during the process leading up to formation of the sidewall silicon dioxide layer 38 and the formation of gate oxide layer 41(FIG. 3F.) After removing the silicon nitride isolating layer 30, the polysilicon 2 intermediate control gate layer 28 and polysilicon 3 control gate layer 40 (FIG. 3G) can be short circuited together.)

Thin Tunnel Oxide Etch

Then, as shown in FIG. 3E, the newly exposed portions of thin tunnel oxide layer 22 which are not covered by the stack of layers 22, 24, 26, 28 and 30 and by sidewall spacers 38 is etched away by means of HF in a wet etch.

Gate Oxide and Field Oxide Growth

As shown in FIG. 3F, a second layer of dielectric material in the form of gate oxide layer 41 and FOX layer 42 has been grown by thermal oxidation. The gate oxide layer 41 is grown over the P-substrate 21 to a thickness of between about 200Å and about 400Å. At the same time, a thick, field oxide layer 42 has been grown by thermal oxidation over the N+ regions 36' and 36" to a thickness of between about 500Å and about 1,000Å. The thermal oxidation forming layers 41 and 42 is performed at a temperature within the range between about 900° C. and about 1000° C. Note that the silicon nitride isolating layer 30 remained in place as the gate oxide layer 41 and field oxide layer 42 are grown for the purpose of preventing the polysilicon 2 intermediate control gate layer 28 from being oxidized during the growth of the oxide layers 41 and 42.

Stripping of silicon nitride

FIG. 3F also shows the device of FIG. 3E after the etching away of the remaining silicon nitride isolating layer 30 at the top of the stack of layers 22, 24, 26 and 28. The isolating layer 30 is stripped by phosphoric acid ($H_3PO_4$) in a wet etch.

Control Gate Layer

Figure 3G:
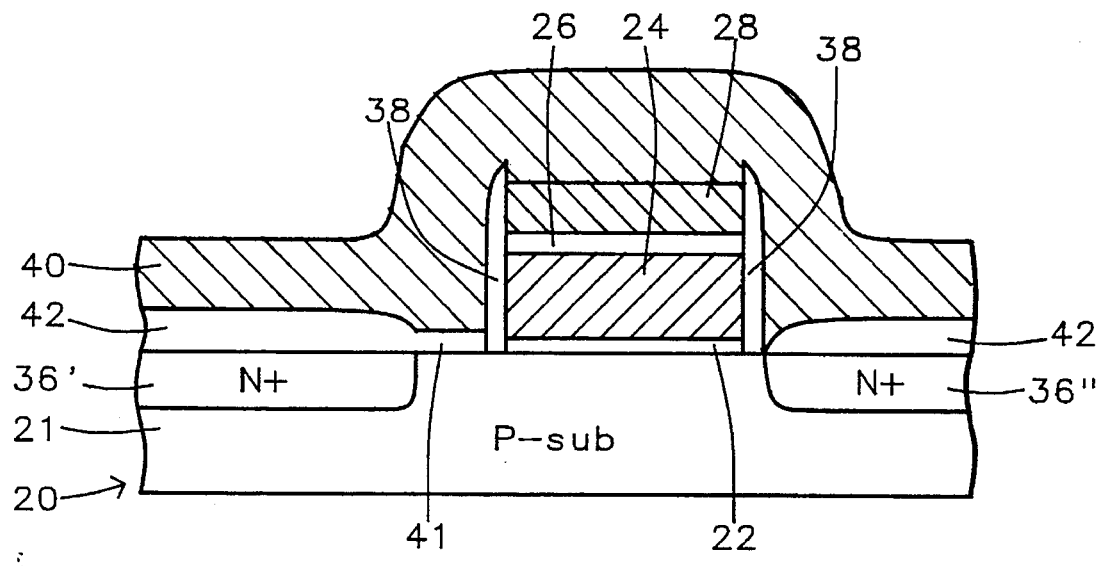
FIG. 3G shows the device of FIG. 3F after deposition of a third polysilicon, control gate layer which will serve as a control gate was deposited.

FIG. 3G shows the device of FIG. 3F after deposition of a polysilicon 3 control gate layer 40 which will serve as a control gate is deposited to a conventional thickness of between about 2000Å and about 4000Å.

The polysilicon 3 control gate layer 40 is doped with a blanket doping of phosphoryl chloride ($POCl_3$) at about 900° C. for 20 minutes.

Control Gate (Word Line) Masking

Figure 3H:
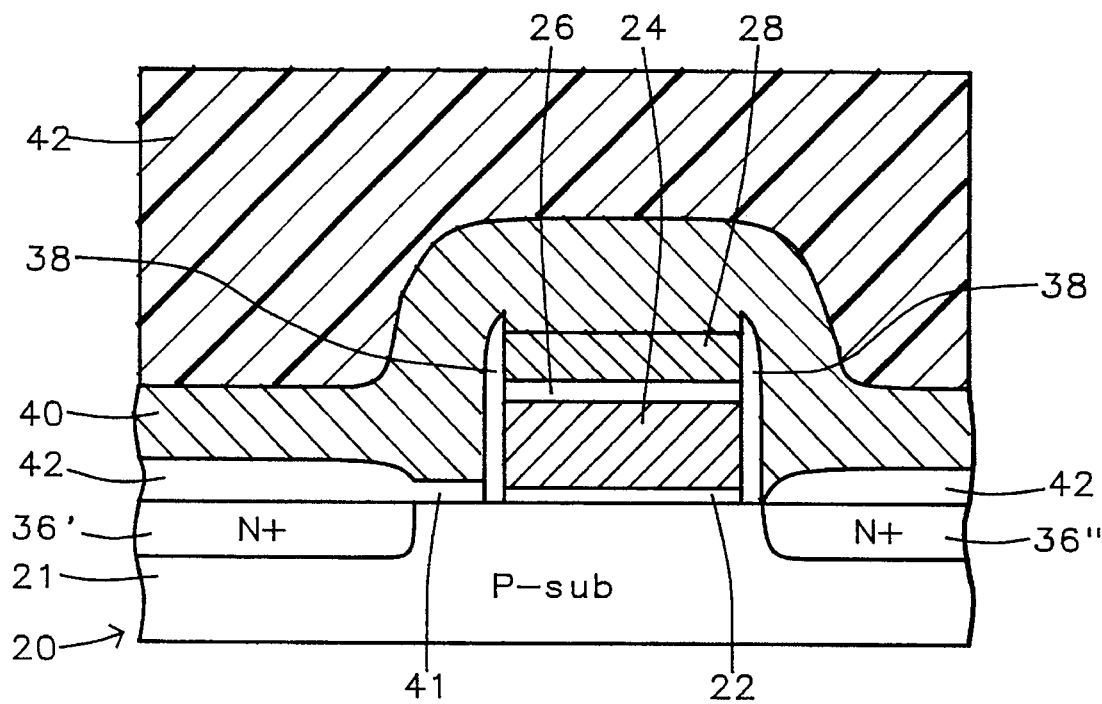
FIG. 3H shows the device of FIG. 3G after a mask layer is formed over third polysilicon control gate layer. The mask is patterned to form a word line in the conventional manner.

FIG. 3H shows the device of FIG. 3G after a mask layer 42 is formed over polysilicon 3 control gate layer 40. Mask 42 is patterned to form a word line in the conventional manner.

Figure 3I:
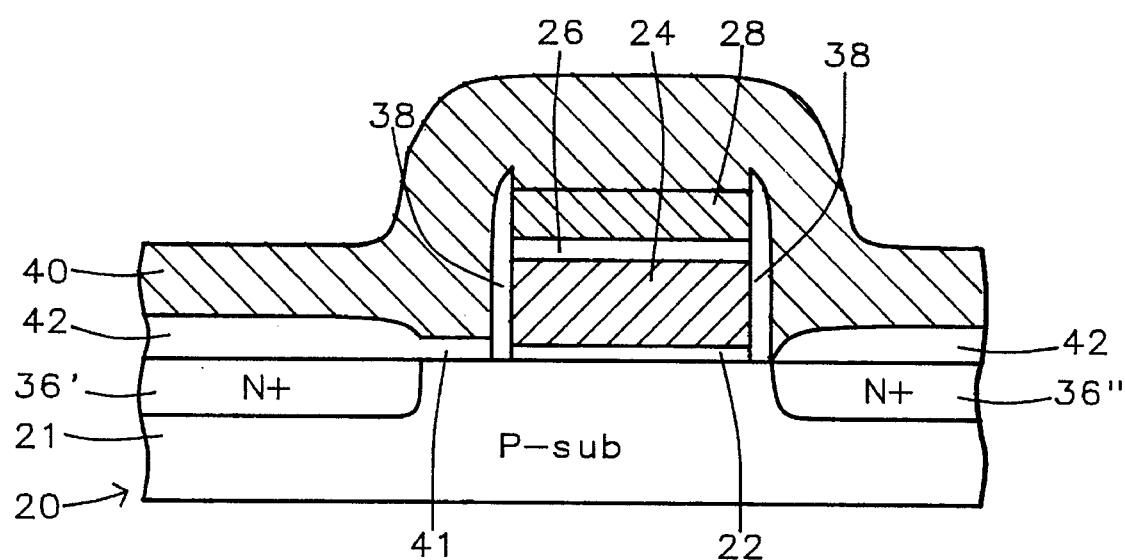
FIG. 3I shows the device of FIG. 3H after the third polysilicon, control gate layer has been etched using a conventional etchant using the mask for patterning the third polysilicon, control gate layer.

FIG. 3I shows the device of FIG. 3H after the polysilicon 3 control gate layer 40 has been etched using a conventional etchant using the mask 42 for patterning the polysilicon 3 control gate layer 40.

Back end process

Conventional back end process steps follow.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A MOSFET device on a lightly doped semiconductor substrate comprising:

a first dielectric layer over a first portion of said substrate;

a floating gate over said dielectric layer, said floating gate layer comprising a floating gate layer;

a first intergate dielectric layer over said floating gate layer;

an intermediate control gate layer over said intergate dielectric layer, said first dielectric layer, said floating gate, said first intergate dielectric layer, and said intermediate control gate layer formed in a stacked structure with a pair of opposing edges of said floating gate, said intergate dielectric layer and said intermediate control gate vertically aligned;

doped source/drain regions in said substrate adjacent to said stacked structure, with one of said source/drain regions aligned with said stacked structure and the other thereof being spaced away from the other side of said stacked structure;

a second intergate dielectric layer formed as sidewalls adjacent to said stack, said first intergate dielectric layer being undamaged by formation of said second intergate dielectric layer;

an isolating dielectric layer over said substrate and said source/drain regions; and a control gate over said device.

2. A device in accordance with claim 1 where said second intergate dielectric layer comprises gate oxide having a thickness of between about 200Å and about 400Å over said substrate and a thick, field oxide layer having a thickness of between about 500Å and about 1,000Å over said source/drain regions.

3. A device in accordance with claim 1, wherein said source/drain regions having a structure produced by ion implantation into said substrate with arsenic (As) N+ dopant with an energy between about 30 KeV and about 100 KeV, and a dose of As within a range of doses between about $1\times10^{15}/cm^2$ and about $1\times10^{15}/cm^2$.

4. A device in accordance with claim 1 with said intermediate control gate layer having a thickness of between about 500Å and about 800Å.

5. A device in accordance with claim 1 wherein said isolating dielectric layer has a thickness of between about 200Å and about 1,000Å.

6. A device in accordance with claim 1 wherein said control gate layer has a thickness of between about 2000Å and about 4,000Å.

7. A device in accordance with claim 1 wherein said intermediate control gate layer has a thickness of between about 500Å and about 800Å.

8. A device in accordance with claim 7 wherein said isolating dielectric layer has a thickness of between about 200Å and about 1,000Å.

9. A device in accordance with claim 8 wherein said control gate layer has a thickness of between about 2000Å and about 4,000Å.

10. A MOSFET device on a lightly doped semiconductor substrate comprising:

a tunnel oxide layer over a first portion of said substrate;

a first polysilicon layer over said tunnel oxide layer, said first polysilicon layer comprising a floating gate;

a first ONO layer over said first polysilicon layer;

a second polysilicon layer over said first ONO layer, said tunnel oxide layer, said first polysilicon layer, said first ONO layer, said second polysilicon layer formed in a stacked structure with edges of said second polysilicon layer, said first ONO layer and said second polysilicon layer vertically aligned;

doped source/drain regions in said substrate adjacent to said stacked structure with one of said source/drain regions aligned with said stacked structure and the other thereof being spaced away from the other side of said stacked structure;

a second ONO layer formed as sidewalls adjacent to said stack, said first ONO layer being undamaged by formation of said second ONO layer;

a dielectric layer over said substrate and said source/drain regions; and a third polysilicon control gate over said device.

11. A device in accordance with claim 10 where said second ONO layer comprises gate oxide having a thickness of between about 200Å and about 400Å over said substrate and a thick, field oxide layer having a thickness of between about 500Å and about 1,000Å over said source/drain regions.

12. A device in accordance with claim 10, wherein said source/drain regions having a structure produced by ion implantation into said substrate with arsenic (As) N+ dopant with an energy between about 30 KeV and about 100 KeV, and a dose of As within a range of doses between about $1\times10^{15}/cm^2$ and about $1\times10^{15}/cm^2$.

13. A device in accordance with claim 10 with said second polysilicon layer having a thickness of between about 500Å and about 800Å.

14. A device in accordance with claim 10 wherein said dielectric layer has a thickness of between about 200Å and about 1,000Å.

15. A device in accordance with claim 10 wherein said third polysilicon layer has a thickness of between about 2,000Å and about 4,000Å.

16. A device in accordance with claim 11 wherein said second polysilicon layer has a thickness of between about 500Å and about 800Å.

17. A device in accordance with claim 16 wherein said dielectric layer has a thickness of between about 200Å and about 1,000Å.

18. A device in accordance with claim 17 wherein said third polysilicon layer has a thickness of between about 2,000Å and about 4,000Å.

* * * * *